(12) United States Patent
Jian

(10) Patent No.: US 8,324,987 B2
(45) Date of Patent: Dec. 4, 2012

(54) DEVICE AND METHOD FOR CASCADING FILTERS OF DIFFERENT MATERIALS

(75) Inventor: Chun-Yun Jian, Ottawa (CA)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/209,977

(22) Filed: Aug. 15, 2011

(65) Prior Publication Data
US 2011/0298565 A1    Dec. 8, 2011

Related U.S. Application Data

(63) Continuation of application No. 12/424,068, filed on Apr. 15, 2009, now Pat. No. 8,018,304.

(51) Int. Cl.
*H03H 9/46* (2006.01)
*H03H 9/64* (2006.01)

(52) U.S. Cl. .......................... 333/189; 333/193

(58) Field of Classification Search ............... 333/133, 333/187, 188, 189, 193, 194, 195
See application file for complete search history.

(56) References Cited

U.S. PATENT DOCUMENTS

| | | |
|---|---|---|
| 6,201,457 B1 | 3/2001 | Hickernell |
| 6,278,342 B1 | 8/2001 | Ellä |
| 6,807,405 B1 | 10/2004 | Jagger et al. |
| 6,809,611 B2 | 10/2004 | Ishizaki et al. |
| 7,589,606 B2 * | 9/2009 | Takayama et al. ............ 333/193 |

FOREIGN PATENT DOCUMENTS

| | | |
|---|---|---|
| EP | 1 298 756 A2 | 4/2003 |
| WO | 00/30253 A1 | 5/2000 |
| WO | 03/069777 A1 | 8/2003 |
| WO | 2005/027535 A2 | 3/2005 |
| WO | 2009/001170 A2 | 12/2008 |

OTHER PUBLICATIONS

International Search Report from corresponding PCT Application No. PCT/CA2010/000542 dated Jun. 7, 2010, 2 pages total.

* cited by examiner

*Primary Examiner* — Dean O Takaoka
(74) *Attorney, Agent, or Firm* — Meyertons, Hood, Kivlin, Kowert & Goetzel, P.C.

(57) ABSTRACT

Some embodiments of the invention provide a filter having at least one first filter, each first filter being a band-reject type filter having a first set of filter parameters that are a function of a first material used to fabricate the at least one first filter, and at least one second filter, each second filter having a second set of filter parameters that are a function of a second material used to fabricate the at least one second filter, each second filter being one of a band-reject type filter and a band pass type filter. The at least one first filter and the at least one second filter are then cascaded together to form the filter. The first material and the second material are different materials. The cascaded filter has a new third set of filter parameters that are a function of both the first material and the second material. Other embodiments of the invention include a method for fabricating the filter and a method of filtering using such a cascaded filter.

18 Claims, 15 Drawing Sheets

DEVICE AND METHOD FOR CASCADING FILTERS OF DIFFERENT MATERIALS

RELATED APPLICATIONS

This application is a continuation of U.S. patent application Ser. No. 12/424,068 filed on Apr. 15, 2009, which is incorporated herein by reference in its entirety, and claims the benefit thereof.

FIELD OF THE INVENTION

The invention relates to cascading multiple filters.

BACKGROUND OF THE INVENTION

There is a strong need in the telecommunications market, particularly in the area of 4G wireless communication systems, as well as in existing wireless systems, for miniature type filters with improved performance from current levels. As 4G systems target a very high speed data transfer, they need much wider bandwidth than existing systems such as GSM, CDMA and UMTS. On the other hand, limited frequency resources in 4G systems require wireless carrier companies to set guard-bands as narrow as possible to enable maximum user capacity. Combining these two issues means that the 4G wireless systems require miniature RF filters for their wireless terminal devices that not only have a wide pass band or reject-band, but also have steep transition bands.

Due to their miniature size and low cost, acoustic materials-based RF filters such as surface acoustic wave (SAW), thin film bulk acoustic resonator (FBAR) and/or bulk acoustic wave (BAW) filters are widely used in compact and portable type terminal devices of various wireless systems. However, the current level of filter performance of these filters is still far from 4G wireless system filter requirements.

Some non-acoustic microwave technology type filters, such as metal-type cavity filters or dielectric filters can be designed to meet filter performance requirements for these applications, but these types of designs have an ultra-high cost and result in physically large filters. As a result, metal-type cavity filters and dielectric filters are undesirable, particularly for applications in wireless terminals, for which size and weight are of considerable importance.

SUMMARY OF THE INVENTION

According to a first aspect of the invention, there is provided a filter comprising: at least one first filter, each first filter being a band-reject type filter having a first set of filter parameters that are a function of a first material used to fabricate the respective first filter; at least one second filter, each second filter having a second set of filter parameters that are a function of a second material used to fabricate the respective second filter, each second filter being one of: a band-reject type filter; and a band pass type filter; wherein at least one of the at least one first filter and at least one of the at least one second filter are cascaded together; wherein the first material and the second material are different materials; and wherein the filter has a third set of filter parameters that are a function of both the first material and the second material.

In some embodiments, each first filter is a narrow band band-reject type filter with a filter response having at least one rejection band, each rejection band having steep transition bands relative to transition bands of each second filter.

In some embodiments, the first material has a smaller magnitude temperature coefficient than the second material such that each first filter has less temperature dependent frequency drift than each second filter.

In some embodiments, each second filter is one of: a wide band band pass type filter; and a wide band band-reject type filter.

In some embodiments, the second material has a higher electro-mechanical coupling coefficient than the first material.

In some embodiments, each first filter has one of: a first rejection band being arranged at a low side edge of a passband of one of the at least one second filter; a first rejection band being arranged at a low side edge of a rejection band of one of the at least one second filter; a first rejection band being arranged at a high side edge of a passband of one of the at least one second filter; a first rejection band being arranged at a high side edge of a rejection band of one of the at least one second filter; two rejection bands, a first rejection band of the two rejection bands being arranged at a low side edge of a passband of one of the at least one second filter and a second rejection band of the two rejection bands being arranged at a high side edge of the passband of one of the at least one second filter; and two rejection bands, a first rejection band of the two rejection bands being arranged at a low side edge of a rejection band of one of the at least one second filter and a second rejection band of the two rejection bands being arranged at a high side edge of the rejection band of one of the at least one second filter.

In some embodiments, each first filter is fabricated using any one of: surface acoustic wave (SAW) technology; thin film bulk acoustic resonator (FBAR) technology; and bulk acoustic wave (BAW) filter technology; and each second filter is fabricated using any one of: SAW technology; FBAR technology; and BAW filter technology.

In some embodiments, the first material comprises at least one of: Quartz; Langasite; $SiO_2/ZnO/Diamond$; $SiO_2/AlN/Diamond$; $Li_2B_4O_7$; $AlN/Li_2B_4O_7$; $LiTaO_3$; $LiNbO_3$; $SiO_2/LiTaO_3$; $SiO_2/LiNbO_3$; AlN; and combinations thereof.

In some embodiments, the second material comprises at least one of: Quartz; Langasite; $SiO_2/ZnO/Diamond$; $SiO_2/AlN/Diamond$; $Li_2B_4O_7$; $AlN/Li_2B_4O_7$; $LiTaO_3$; $LiNbO_3$; $SiO_2/LiTaO_3$; $SiO_2/LiNbO_3$; ZnO; AlN; and combinations thereof.

In some embodiments, a first filter of the at least one first filter and a second filter of the at least one second filter are cascaded together in a package using at least one of: a link directly electrically connecting the first filter and the second filter; and a shared point of connection within the package to which the first filter and the second filter are electrically connected.

In some embodiments, the filter further comprises at least one of: a circuit matching element for matching at least one of an input to the filter and an output from the filter; a circuit matching element for matching a first filter of the at least one first filter; a circuit matching element for matching a second filter of the at least one second filter; and a circuit matching element for matching a point in the filter at which a first filter of the at least one first filter and a second filter of the at least one second filter are cascaded together.

According to a second aspect of the invention there is provided a method for fabricating a filter comprising: cascading at least one first filter, each first filter being a band-reject type filter having a first set of filter parameters that are a function of a first material used to fabricate the respective first filter, together with at least one second filter, each second filter having a second set of filter parameters that are a function of a second material used to fabricate the respective second filter, each second filter being one of: a band-reject type filter; and a band pass type filter; wherein the first material and the second material are different materials; and wherein the filter has a third set of filter parameters that are a function of both the first material and the second material.

In some embodiments, cascading at least one first filter and at least one second filter comprises: cascading a first filter of the at least one first filter, the first filter being a narrow band band-reject type filter with a filter response having at least one rejection band, each rejection band having steep transition bands relative to transition bands of each of the at least one second filter, with a second filter of the at least one second filter.

In some embodiments, the first material has a smaller magnitude temperature coefficient than the second material, such that each first filter of the at least one first filter has less temperature dependent frequency drift than each second filter of the at least one second filter.

In some embodiments, cascading at least one first filter and at least one second filter comprises: cascading a first filter of the at least one first filter with a second filter of the at least one second filter, the second filter being one of: a wide band band pass type filter; and a wide band band-reject type filter.

In some embodiments, the second material has a higher electro-mechanical coupling coefficient than the first material.

In some embodiments, cascading the at least one first filter and the at least one second filter comprises: cascading a first filter of the at least one first filter, wherein the first filter is fabricated using any one of: surface acoustic wave (SAW) technology; thin film bulk acoustic resonator (FBAR) technology; and bulk acoustic wave (BAW) filter technology; with a second filter of the at least one second filter, wherein the second filter is fabricated using any one of: SAW technology; FBAR technology; and BAW filter technology.

In some embodiments, each first filter has one of: a first rejection band being arranged at a low side edge of a passband of one of the at least one second filter; a first rejection band being arranged at a low side edge of a rejection band of one of the at least one second filter; a first rejection band being arranged at a high side edge of a passband of one of the at least one second filter; a first rejection band being arranged at a high side edge of a rejection band of one of the at least one second filter; two rejection bands, a first rejection band of the two rejection bands being arranged at a low side edge of a passband of one of the at least one second filter and a second rejection band of the two rejection bands being arranged at a high side edge of the passband of one of the at least one second filter; and two rejection bands, a first rejection band of the two rejection bands being arranged at a low side edge of a rejection band of one of the at least one second filter and a second rejection band of the two rejection bands being arranged at a high side edge of one of the rejection band of the at least one second filter.

In some embodiments, cascading at least one first filter and at least one second filter comprises: cascading a first filter of the at least one first filter with a second filter of the at least one second filter, wherein the first filter is fabricated using the first material, which comprises at least one of: Quartz; Langasite; $SiO_2/ZnO/Diamond$; $SiO_2/AlN/Diamond$; $Li_2B_4O_7$; $AlN/Li_2B_4O_7$; $LiTaO_3$; $LiNbO_3$; $SiO_2/LiTaO_3$; $SiO_2/LiNbO_3$; AlN; and combinations thereof.

In some embodiments, cascading at least one first filter and at least one second filter comprises: cascading a first filter of the at least one first filter with a second filter of the at least one second filter, wherein the second filter is fabricated using the second material, which comprises at least one of: Quartz; Langasite; $SiO_2/ZnO/Diamond$; $SiO_2/AlN/Diamond$; $Li_2B_4O_7$; $AlN/Li_2B_4O_7$; $LiTaO_3$; $LiNbO_3$; $SiO_2/LiTaO_3$; $SiO_2/LiNbO_3$; ZnO; AlN; and combinations thereof.

In some embodiments, cascading at least one first filter and at least one second filter comprises: cascading a first filter of the at least one first filter with a second filter of the at least one second filter together in a package using at least one of: a link directly electrically connecting the first filter and the second filter; and a shared point of connection to which the first filter and the second filter are electrically connected.

In some embodiments, cascading the at least one first filter and the at least one second filter comprises: circuit matching at least one of an input to the device and an output from the filter; circuit matching a first filter of the at least one first filter; circuit matching a second filter of the at least one second filter; and circuit matching a point in the filter at which a first filter of the at least one first filter and a second filter of the at least one second filter are cascaded together.

According to a third aspect of the invention, there is provided method for filtering a signal comprising: providing a signal to an input of a first filter, the first filter being a band-reject type filter having a first set of filter parameters that are a function of a first material used to fabricate the first filter; filtering the signal using the first filter thereby producing an output of the first filter; providing the output of the first filter to a second filter, the second filter having a second set of filter parameters that are a function of a second material used to fabricate the second filter, the second filter being one of a band-reject type filter and a band pass type filter; filtering the output of the first filter using the second filter thereby producing an output of the second filter; wherein the first material and the second material are different materials; and wherein the combination of the first filter and the second filter has a third set of filter parameters that are a function of both the first material and the second material.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the invention will now be described with reference to the attached drawings in which.

DETAILED DESCRIPTION OF THE EMBODIMENTS OF THE INVENTION

Due to the desire for miniature sizing and low cost, surface acoustic wave (SAW), thin film bulk acoustic resonator (FBAR) and/or bulk acoustic wave (BAW) technology filters have became much utilized components in compact and portable type terminal devices for various modern wireless communication systems. Band pass type and band-reject type filters can be designed using SAW, FBAR and BAW technologies. However, current SAW, BAW and FBAR filter design technologies can not provide a filter solution having further improved filter performance such as steeper transition band and higher power handling capability. After over 30 years of filter technology development for SAW, 15 years for FBAR and 10 years for BAW, it can be said that substantially close to maximum filter performance for these types of devices has been reached. Therefore, no large scale performance improvements are likely to occur for single substrate filters based on existing SAW, FBAR and BAW filter design technologies, unless new materials are realized.

Figure 1A:
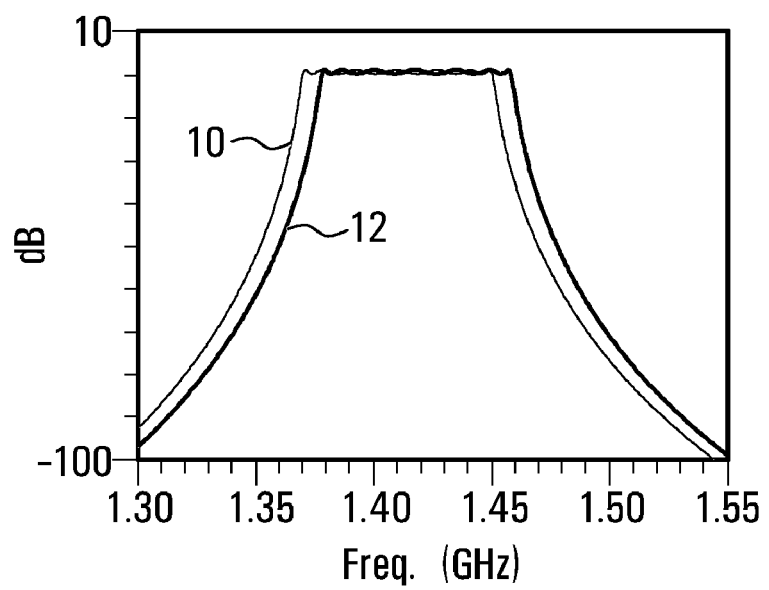
FIG. 1A is a graphical plot of a pair of wide band pass band filter responses, one response at a high temperature and one response at a low temperature.

Materials for fabricating filters with high electro-mechanical coupling coefficients are suitable for implementing band-reject or band pass filters with respective wide transition bands and a wide rejection band or wide pass band. However, usually the materials have poor temperature stability due to a large magnitude temperature coefficient, which results in a frequency response in devices made from the material having a large temperature dependent frequency response drift. Current wide band filters designed using SAW, FBAR and BAW technologies have two particularly troubling drawbacks: transition band bandwidths that are not steep enough and large temperature dependent frequency response drift. FIG. 1A illustrates an example of a computer simulation of a band pass filter response for a single substrate material filter that could be fabricated by any one of SAW, FBAR, or BAW technologies. The frequency range indicated along the x-axis is from 1.30 GHz to 1.55 GHz. The attenuation range on the y-axis ranges from 10 dB to −100 dB. A first filter response 10 in FIG. 1A is a frequency response of the filter operating at a temperature of approximately 85° C. The 3 dB bandwidth of the first filter response 10 is in the range of approximately 0.080 GHz, from 1.370 GHz to 1.450 GHz. A second filter response 12 in FIG. 1A is a frequency response of the same filter operating at a temperature of approximately −40° C. The 3 dB bandwidth of the second filter response 12 is in the same range of approximately 0.080 GHz, from 1.380 GHz to 1.460 GHz. For each of the frequency responses 10,12 it can be seen that the transition band on either side of the pass band is rather large, for example, for the filter response 10 in FIG. 1A a 20 dB down transition bandwidth is approximately 0.010 GHz, from 1.360 GHz to 1.370 GHz on the lower side of the pass band and approximately 0.010 GHz, from 1.460 GHz to 1.470 GHz on the higher side of the pass band. The temperature dependent frequency response drift, the change in frequency at a similar attenuation value, between the high temperature and the low temperature filter responses 10 and 12 is approximately equal to 0.010 GHz.

Figure 1B:
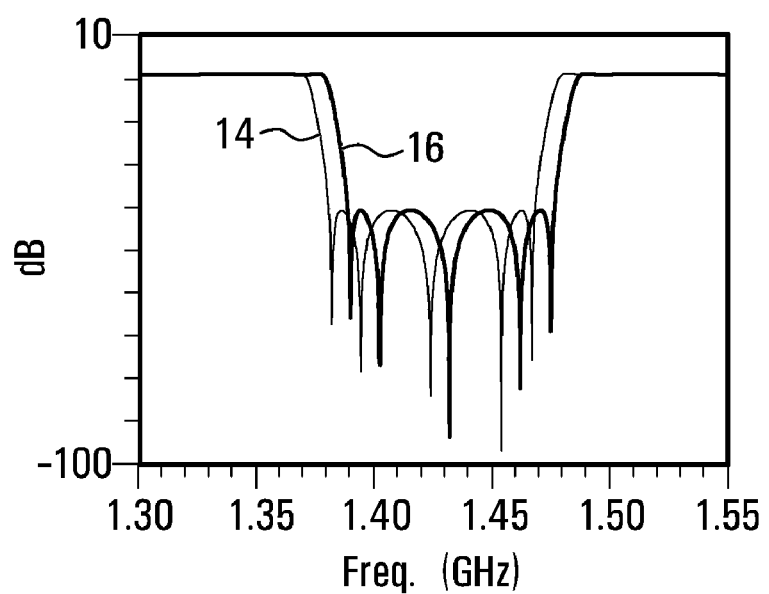
FIG. 1B is a graphical plot of a pair of wide band rejection band filter responses, one response at a high temperature and one response at a low temperature.

FIG. 1B illustrates band-reject filter responses for a high temperature 14 and a low temperature 16 showing a similar frequency response drift over temperature and a similarly wide transition band that is illustrated for the filter responses of FIG. 1A.

There is almost no room in existing SAW, FBAR and BAW design technologies for further improvement to the narrowing of the transition band bandwidth. Currently, the maximum achievable transition band steepness in such filters is limited by the Q factor inherent in the materials used in the filters. A high Q factor enables the steep transition band filter characteristic. However, the materials with a high electro-mechanical coupling coefficient, which is a material property that enables the wide bandwidth filter characteristic, in general, have a lower Q factor in comparison to the materials with a low electro-mechanical coupling coefficient. High electro-mechanical coupling coefficient materials also typically have poorer temperature stability. Therefore, the transition band bandwidth of wide band type filters, such as those shown in FIG. 1A and 1B, is relatively wide and the filter response varies more significantly over the operating temperature range.

Materials for fabricating filters with low temperature coefficients are suitable for implementing band-reject or band pass filters having very low temperature dependent frequency drift. Materials with a low temperature coefficient typically also have a low coupling coefficient. A low coupling coefficient results in a narrow band filter.

Quartz is one of the most temperature-stable substrates in crystal device technology and has a very high Q, but its coupling coefficient is quite small, for example 0.11% in some SAW implementations. As such, Quartz is very good for designing narrow band type filters having a very sharp transition band.

Figure 2A:
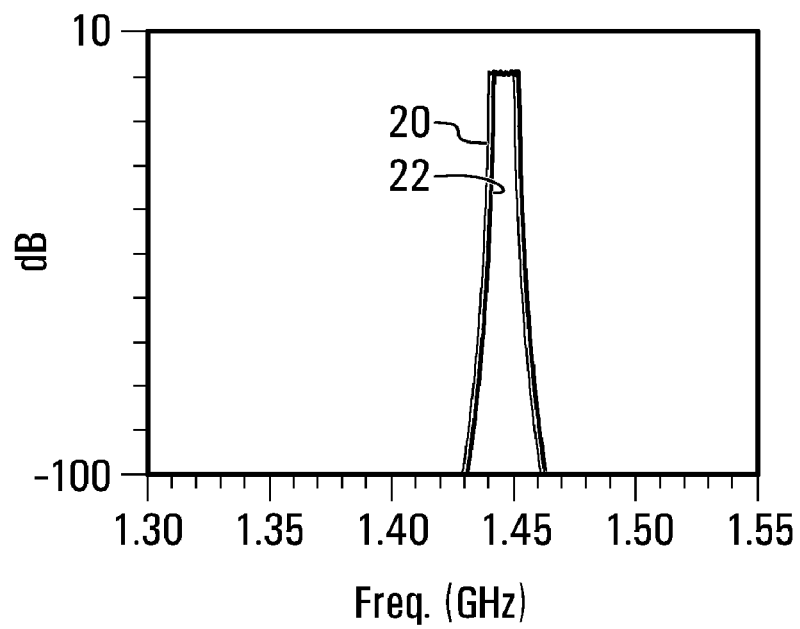
FIG. 2A is a graphical plot of a pair of narrow band pass band filter responses, one response at a high temperature and one response at a low temperature.
Figure 2B:
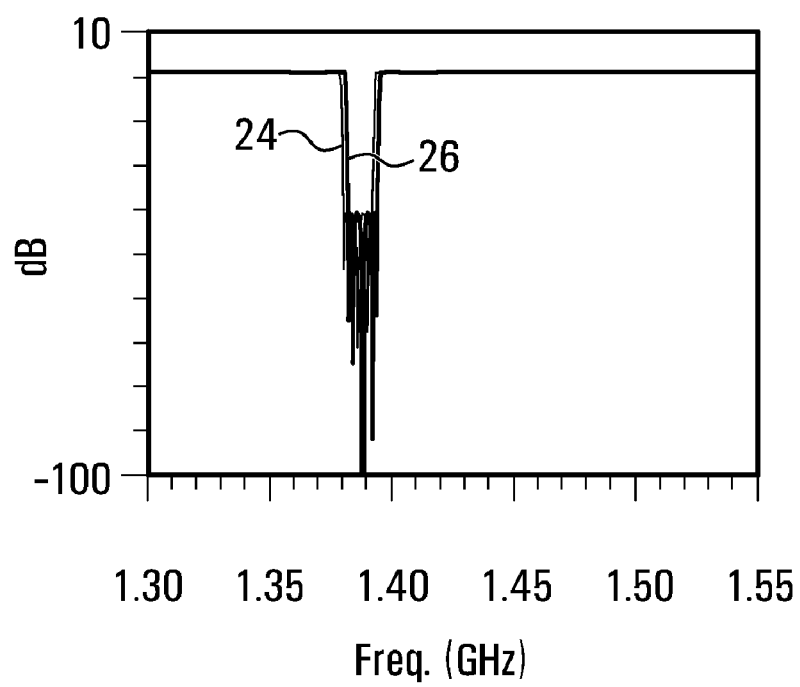
FIG. 2B is a graphical plot of a pair of narrow band band-reject filter responses, one response at a high temperature and one response at a low temperature.

FIG. 2A illustrates an example of a computer simulation of a band pass filter response for a single substrate material filter that may have been fabricated by any one of SAW, FBAR, or BAW technologies. The frequency and attenuation ranges are similar to FIG. 1A discussed above. A first filter response 20 of the filter in FIG. 2A is a frequency response operating at a temperature of approximately 85° C. The 3 dB bandwidth of the first filter response 20 is in the range of approximately 0.008 GHz, from 1.442 GHz to 1.450 GHz. A second filter response 22 in FIG. 2A is a frequency response of the same filter operating at a temperature of approximately −40° C. The 3 dB bandwidth of the second filter response 22 is in the range of approximately 0.008 GHz, from 1.443 GHz to 1.451 GHz. The 3 dB bandwidth is approximately 1/10 of the 3 dB bandwidth shown in FIG. 1A for the device fabricated with a higher coupling coefficient material. For each of the frequency responses 20,22 it can be seen that the transition band on either side of the pass band is rather small, especially in relation to transition band of the wide band filter responses of FIG. 1A. For example, a 20 dB down transition bandwidth of the filter response of FIG. 2A is approximately 0.001 GHz, from 1.442 GHz to 1.443 GHz on the lower side of the pass band and 1.450 GHz to 1.451 GHz on the higher side of the pass band. The transition band bandwidth is approximately ⅒ of the transition band bandwidth shown in FIG. 1A for the device fabricated with a higher coupling coefficient material. The temperature dependent frequency response drift, the change in frequency at a similar attenuation value, between filter responses 20 and 22 is approximately equal to 0.002 GHz. This is approximately ⅕ of the temperature dependent frequency response drift shown in FIG. 1A for the device fabricated with a higher coupling coefficient material. FIG. 2B illustrates a band-reject filter response showing a similar frequency response drift over temperature and a similarly narrow transition band.

The filter response parameters associated with the examples of FIGS. 1A, 1B, 2A and 2B are merely exemplary in nature. The parameters involved in designing filters for any given application are implementation specific.

One way of improving the drawback of large temperature dependent frequency drift in a SAW filter fabricated with the high coupling coefficient material is to deposit a thin film of $SiO_2$ over the high coupling coefficient material. $SiO_2$ has a temperature coefficient opposite to that of the high coupling coefficient materials used for SAW designs. Therefore, the thin film of $SiO_2$ compensates for the high temperature coefficient of the high coupling coefficient material. However, this process adversely affects achievable filter performance because the $SiO_2$ film reduces the effective coupling coefficient of the combined $SiO_2$ coated high coupling coefficient material, and as a result, the achievable maximum bandwidth of the SAW filter is decreased. In addition, due to a mass loading effect caused by the $SiO_2$ film, phase velocity of the SAW on the combined substrates is reduced, which corresponds to a reduction in the width of electrode fingers in the physical implementation of the SAW devices. This is undesirable for high frequency (>2 GHz) SAW filter designs.

In some embodiments of the invention a filter solution is provided that is appropriate for a guard-band-reduced special type 1900 MHz CDMA and/or 1.5 GHz to 2.5 GHz WiMAX wireless systems. These wireless systems would benefit from a high performance filter that has low insertion loss, high power handling capability and a very narrow transition band. Furthermore, filters for such applications are desired to be low cost and very compact such that they can be used in wireless terminals, such as cellular telephones, wireless enabled PDAs computer, etc. While some guard-band-reduced special type 1900 MHz CDMA and/or 1.5 GHz to 2.5 GHz WiMAX wireless systems may benefit from embodiments of a filter solution as described herein, it is to be understood that embodiments of the invention may be applicable for other communication standards operating in other frequency bands.

In general, for SAW, FBAR and BAW fabricated filters, wide band band pass type filters or wide band band-reject type filters (3% or above) with a low insertion loss requirement (<3 dB) are designed using high coupling coefficient materials ($K^2$>2%). The higher the coupling coefficient of the material used, the wider the maximum bandwidth of the filter. However, materials with high coupling coefficients quite typically have larger magnitude temperature coefficients, in comparison with low coupling coefficient materials. For example, 42Y-X $LiTaO_3$, which is considered to be a high coupling coefficient material, has a coupling coefficient of $K^2$=4.7% and a temperature coefficient of −45 ppm/° C. On the other hand, ST-Quartz, which is considered to be a low coupling coefficient material, has a coupling coefficient of $K^2$=0.12% and a temperature coefficient of 0 ppm/° C. at room temperature. Generally speaking, frequency drift due to temperature variation in filters made of high coupling coefficient material is larger than filters made of low coupling coefficient material. Also, usually high coupling coefficient materials have poorer Q factors than the low coupling coefficient materials. A SAW resonator made of 42Y-X LiTaO3 has a Q ranging from 1000 to 2000, whereas a SAW resonator made of ST-Quartz could have a Q of over 10,000. The difference in the Q factors of resonators made of the different materials shows up as a difference in the steepness of the filter transition-band.

In contrast to high coupling coefficient materials, low coupling coefficient materials ($K^2$<2%) are used for narrow band type band pass or band-reject filter designs. Due to the characteristics of high Q and small temperature coefficient mentioned above, these low coupling coefficient material type narrow band band pass or band-reject filters always have steeper transition band and smaller temperature dependent frequency drift than the high coupling coefficient material type wide band band pass or band-reject filters. Therefore, the low coupling coefficient materials are often used for narrower band type filters designs.

Table 1 below includes a list of different materials (Material Name) that can be used for fabricating SAW, BAW and FBAR devices, and further defines specifically the type of devices the respective material may be used to fabricate (Filter Type). Table 1 also includes an acoustic wave velocity (Velocity), the electro-mechanical coupling coefficient (Coupling Coefficient ($K^2$)) and the Temperature Coefficient at Room Temperature (Temperature Coefficient at Room Temp) for each material in the table.

TABLE 1

Materials used in SAW, FBAR and BAW devices

| Material Name | Filter type | Velocity (m/s) | Coupling Coefficient ($K^2$) (%) | Temperature Coefficient at Room Temp (ppm/° C.) |
| --- | --- | --- | --- | --- |
| ST-Quartz | SAW | 3150 | 0.12 | 0 |
| LST-Quartz | SAW | 3948 | 0.11 | 0 |
| STW-Quartz | SAW | 3700 to 5040 | 0.17 to 0.34 | 0 |
| 48.5Y-26.7X Langasite | SAW | 2735 | 0.31 | 1.1 |
| $SiO_2$/ZnO/ Diamond | SAW | 10,000 | 1.2 | 0 |
| $SiO_2$/AlN/ Diamond | SAW | 11,000 | 0.65 | 0 |
| 45X-Z $Li_2B_4O_7$ | SAW | 3440 | 1 | 0 |
| (−15)Y-75X $Li_2B_4O_7$ | SAW | 4120 | 1.6 | 1.5 |
| (−42.7)Y-90X $Li_2B_4O_7$ | SAW | 6700 | 2 | 6.5 |
| X-112Y $LiTaO_3$ | SAW | 3288 | 0.64 | −18 |
| Y-Z $LiTaO_3$ | SAW | 3230 | 0.66 | −35 |
| 36 to 42Y-X $LiTaO_3$ | SAW | 4200 | 4.7 | −45 |
| 128Y-X $LiNbO_3$ | SAW | 3992 | 5.5 | −74 |
| Y-Z $LiNbO_3$ | SAW | 3488 | 4.9 | −84 |
| 41Y-X $LiNbO_3$ | SAW | 4792 | 17.2 | −78 |
| 64Y-X $LiNbO_3$ | SAW | 4742 | 11.3 | −79 |
| ZnO | FBAR | 6080 | 8.5 | −60 |
| AlN | FBAR | 11300 | 6.5 | −25 |

TABLE 1-continued

Materials used in SAW, FBAR and BAW devices

| Material Name | Filter type | Velocity (m/s) | Coupling Coefficient ($K^2$) (%) | Temperature Coefficient at Room Temp (ppm/° C.) |
|---|---|---|---|---|
| ZnO | BAW | 6080 | 7.5 | −48 |
| AlN | BAW | 11300 | 6 | −22 |

In some embodiments, a first type filter with a lower coupling coefficient and lower temperature coefficient is fabricated with a first material that includes at least one of: Quartz; Langasite; $SiO_2$/ZnO/Diamond; $SiO_2$/AlN/Diamond; $Li_2B_4O_7$; AlN/$Li_2B_4O_7$; $LiTaO_3$; $LiNbO_3$; $SiO_2$/$LiTaO_3$; $SiO_2$/$LiNbO_3$; AlN; and combinations thereof.

In some embodiments, a second type filter with a higher coupling coefficient is fabricated with a second material that includes at least one of: Quartz; Langasite; $SiO_2$/ZnO/Diamond; $SiO_2$/AlN/Diamond; $Li_2B_4O_7$; AlN/$Li_2B_4O_7$; $LiTaO_3$; $LiNbO_3$; $SiO_2$/$LiTaO_3$; $SiO_2$/$LiNbO_3$; ZnO; AlN; and combinations thereof.

There is overlap in the types of materials that can be used to make the filters having the different material properties, i.e. high/low coupling coefficient and high/low temperature coefficient. However, as long as the materials that are used have respective high and low properties with respect to one another, then a cascaded filter with desired properties can be designed and fabricated. Cascaded filter parameters that may be affected by the selection of materials may include, but are not limited to, the width of the wide band portion of the filter response, for either of band pass or band-reject, the amount of temperature dependent frequency drift of the response and the steepness of the transition bands.

By using SAW, FBAR and/or BAW design technologies, some embodiments of the invention result in economically low cost devices having a compact physical size. An aspect of the invention is to cascade at least two SAW, FBAR or BAW design type filters, at least one filter fabricated from a material that has a low temperature coefficient enabling low temperature dependent frequency drift and at least one filter fabricated from a material that has a large electro-mechanical coupling coefficient enabling a wide band (>3%) pass band or wide band reject-band. A combination of the at least two filters whose materials have these different characteristics achieves an overall filter performance with filter parameters that include wide band pass band or wide band reject-band, steep transition band and low temperature dependent frequency drift of the overall cascaded frequency filter response.

In some embodiments of the invention a band reject-type filter fabricated with a material having a low temperature coefficient is cascaded, with one of a band reject-type filter or a band pass type filter, which is fabricated with a material having a high coupling coefficient to achieve a wide band filter with an ultra-narrow transition band and very stable temperature dependent frequency drift of the cascaded filter response.

In a particular example of a cascaded filter implemented according to an embodiment described herein, the cascaded filter has a very wide pass band/reject-band (>3% or >60 MHz@1.93 GHz) and a very steep transition-band (<0.5% or <10 MHz@1.93 GHz) and a very stable temperature dependent frequency drift (<360ppm over −40° C. to 80° C.)

Figure 3:
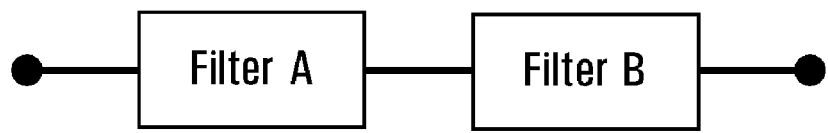
FIG. 3 is a block diagram of two filters cascaded in series in accordance with some embodiments of the invention.

FIG. 3 illustrates a block diagram of two filters, Filter A and Filter B cascaded together. In some embodiments, Filter A is a narrow band filter fabricated using a substrate material having a low coupling coefficient as compared to the coupling coefficient of the material used to fabricate Filter B. The material used to fabricate Filter A has a smaller magnitude temperature coefficient as compared to the temperature coefficient of the material used to fabricate Filter B and as such Filter A has a low temperature dependent frequency drift as compared to the temperature dependent frequency drift of Filter B. Based on the material properties of the material used to fabricate Filter A, Filter A provides a narrow transition band as compared to the transition band of Filter B.

Filter B is a wide band filter fabricated using a substrate material having a higher coupling coefficient as compared to the coupling coefficient of the material used to fabricate Filter A. Based on the material properties of Filter B, Filter B provides a wide pass band or rejection band.

The frequency response of the two cascaded filters, Filter A and Filter B, provides a wide pass band or wide rejection band with a narrow transition band on at least one edge of the wide pass band or wide rejection band. In some embodiments, when Filter A has a filter response with only a single narrow band rejection band, the filter response of cascaded Filters A and B has only a narrow transition band on one side of the wide band pass band or rejection band, either the high frequency end or the low frequency end, depending on the design parameters of Filter A. In some embodiments, when Filter A has a filter response with at least two narrow band rejection bands, the filter response of cascaded Filters A and B has narrow transition bands on both sides of the wide band pass band or rejection band depending.

Some embodiments of the invention provide a new type of cascaded FBAR type band pass or band-reject filter with much narrower transition bands, improved temperature stability and also with a wide pass band or rejection band as compared to a single die FBAR type band reject filter or single die FBAR type band pass filter.

Aluminum Nitride (AlN) and Zinc Oxide (ZnO) thin films are popular and widely used piezoelectric materials for FBAR type devices. AlN has a temperature coefficient of approximately −25 ppm/° C. and a coupling coefficient of approximately 6.5%. ZnO has a temperature coefficient of approximately 60 ppm/° C. and a coupling coefficient of approximately 8.5%. AlN has a better Q factor in comparison with the ZnO. Using AlN, which has a larger Q factor and a better temperature stability than the ZnO, as a material for fabricating a filter provides a filter with a steep transition band and a low temperature dependent frequency drift. Using ZnO, which has a higher coupling coefficient than AlN, as a material for fabricating a filter provides a filter with a wider band pass band or wide band reject-band filter. By cascading two FBAR type filters, one of which is a band reject type filter fabricated using AlN and the other one of which is either a band pass type filter or a band reject type filter fabricated using ZnO, a new FBAR filter having filter parameters that include a narrower transition band, wider band pass band or wider band rejection band, and lower temperature dependent frequency drift, than either of the single die type AlN or ZnO FBAR filters could individually provide, is obtained. In alternative implementations, the band reject type FBAR filter made of AlN mentioned above can be replaced by either a SAW band reject filter or a BAW band reject filter that has filter characteristics such as steep transition band and small frequency drift over a temperature range to obtain a new performance band pass type or band reject type filter.

In a given filter design, the filter transition band steepness, the maximum frequency drift over operating temperature range, as well as manufacturing tolerances for a specific material, all have to be taken into consideration for meeting guard-band specifications. In general, a single material substrate filter fabricated with a high coupling coefficient material having a wider band type response and a larger amount of temperature dependent frequency drift needs a much wider guard-band specification than the low coupling coefficient material narrow band type filters.

In some embodiments, a cascaded filter includes at least one first filter, each first filter being a band-reject type filter having a first set of filter parameters that are a function of a first material used to fabricate the at least one first filter. The cascaded filter also includes at least one second filter, each second filter having a second set of filter parameters that are a function of a second material used to fabricate the at least one second filter. Each second filter is one of a band-reject type filter and a band pass type filter. The at least one first filter and the at least one second filter are cascaded together to form the cascaded filter. In some embodiments, the first material and the second material are different materials. The cascaded filter has a third set of filter parameters that are a function of both the first material and the second material.

In some embodiments, the cascaded filter includes two separate dies, which are made of different materials. In some embodiments a same filter design technology is used for both filters, but different materials are used for the respective filters. For example, both filters may be designed and fabricated using SAW, FBAR or BAW. In some embodiments a different filter design and fabrication technology may be used to fabricate the different filters and different materials are used for the respective filters. In a first example, a first filter is fabricated using SAW and a second filter is fabricated using FBAR. In a second example, a first filter is fabricated using FBAR and a second filter is fabricated using BAW. In a third example, a first filter is fabricated using SAW and a second filter is fabricated using BAW. In a fourth example, a first filter is fabricated using BAW and a second filter is fabricated using FBAR. Other combinations of filters are contemplated based on permutations of the different filter design and fabrication technologies. As the two cascaded filters could be a mixed combination of SAW, FBAR and BAW filters, this cascaded filter design has a wide variety of design flexibilities.

Regardless of the filter design and fabrication technology used to fabricate each filter, at least one filter of a first filter type is fabricated using a low coupling coefficient material with a low temperature coefficient, relative to a material used to fabricate at least one filter of a second filter type, to generate a narrow band filter with steep transition band and low temperature dependent frequency drift. At least one filter of the second filter type is fabricated using a high coupling coefficient material, relative to a material used to fabricate at least one filter of the first filter type, to generate a wide band type filter.

Due to the different characteristics of the materials of the two filters, the narrow band band-reject type filter can be utilized to improve the two drawbacks that the wide band type filter has, namely a non-steep transition-band and a large temperature dependent frequency drift over the operating temperature range. As long as the narrow band band-reject type filter has a wide enough reject-band and deep enough rejection level to compensate for the drift of the frequency response of the wide band filter over temperature variation, the frequency response of the two filters cascaded together will provide a performance having all beneficial features of each of the two types of filters, namely: 1) a wide pass band or reject-band; 2) a steep transition-band on at least one edge of the wide passband or reject-band; and 3) a low temperature dependent frequency drift of the filter response.

In some embodiments, the two filters share one package. In some embodiments, the cascaded filter package is smaller than if the two filters were separately packaged.

The two separate dies are cascaded electrically through wires and pads inside the package. In some implementations the two cascaded filters are electrically coupled together via short wires and/or circuit pads within the package. In such an implementation there is almost no additional loss, enabling the overall cascaded filter design to achieve a desired low insertion loss.

Figure 9A:
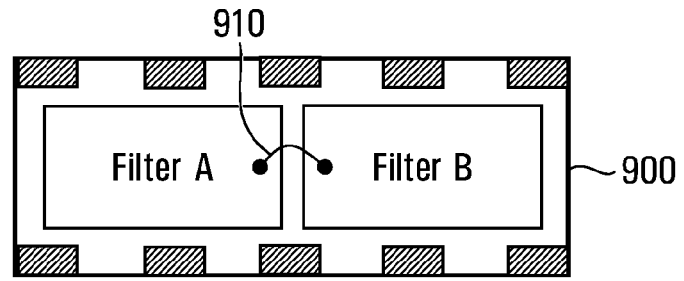
FIG. 9A is a schematic diagram of a direct wire bond connection between two cascaded filters in a package according to an embodiment of the invention.

In some embodiments, a link directly electrically connects the first filter and the second filter. For example, short wire bonds may be used to directly connect one filter to the other. An example of a short wire bond 910 directly connecting Filter A and Filter B in package 900 is illustrated in FIG. 9A.

Figure 9B:
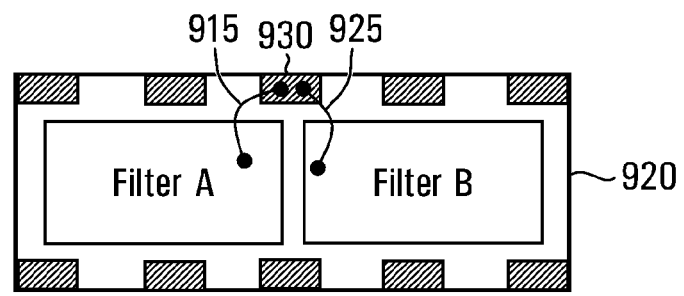
FIG. 9B is a schematic diagram of a shared circuit pad electrical connection between two cascaded filters in a package according to an embodiment of the invention.

In some embodiments, at least one first filter and at least one second filter are each respectively electrically connected to a shared point of connection within the package. In some embodiments, short wire bonds may connect each filter to a circuit pad located within the package and the electrical connection between the filters is made via the shared circuit pad. An example of a first short wire bond 915 connecting Filter A to a pad 930 in package 920 and a second short wire bond 925 connecting Filter B to the pad 930 is illustrated in FIG. 9B.

Figure 9C:
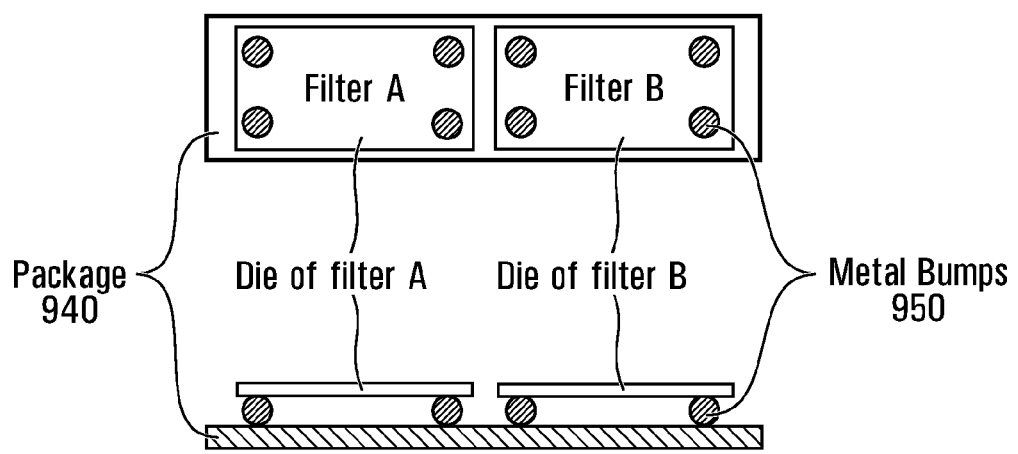
FIG. 9C is a schematic diagram of flip-chip implementation for two cascaded filters according to an embodiment of the invention.

In some embodiments, a flip-chip bonding technology can be used to bond each of the filters to the package using metal bumps. An example of the die of Filter A and the die of Filter B connected to package 940 via metal bumps 950 is illustrated in FIG. 9C. Circuit paths within the package between contact points of the metal bump connections can provide electrical connection between the filters.

The above examples are merely some of the possible implementations for cascading and packaging multiple die filters. Other manners of packaging are contemplated. Furthermore, while only two filters are illustrated in the examples of FIGS. 9A, 9B and 9C, it is to be understood that the principles illustrated in these figures can apply to multi-filter implementations.

In some embodiments, the multi-filter cascade approach is used to implement a filter design for an irregular filter specification that has different widths in the guard-bands.

In some embodiments, only two filters are cascaded together, but the two filters may each provide multiple pass bands or rejection bands. For example, a first filter fabricated using a first material may provide two narrow band rejection bands, with narrow transition bands, that are spaced apart substantially an equivalent distance of a single wide band pass band or wide band rejection band of a second filter fabricated using a second material.

In some embodiments, multiple filters could be cascaded together, each having a particular filter response, which collectively provide a desired overall filter response. For example, a first filter of a first filter type that is fabricated using a first material may provide one narrow band rejection band with steep transition bands at a lower frequency end of a wide band pass band or wide band rejection band of a second filter of a second filter type that is fabricated using a second material. A third filter of the first filter type that is fabricated using the first material may provide one narrow band rejection band with steep transition bands at a higher frequency end of the wide band pass band or wide band rejection band. In some embodiments, the third filter may be fabricated using a third material that has properties that are more similar to the first material than the second material. In such a manner it may be possible to have transition bands with different steepness at the high and low frequency ends of the wide band pass band or wide band rejection band portion of the filter.

Four different embodiments of cascaded filters will now be described for different types of filter response characteristics.

Example Embodiment #1

A first example embodiment in which a wide band pass band filter is cascaded with a narrow band band-reject filter having a rejection band at the higher frequency side of the wide band filter will now be described in relation to FIGS. 4A to 4E.

Figure 4A:
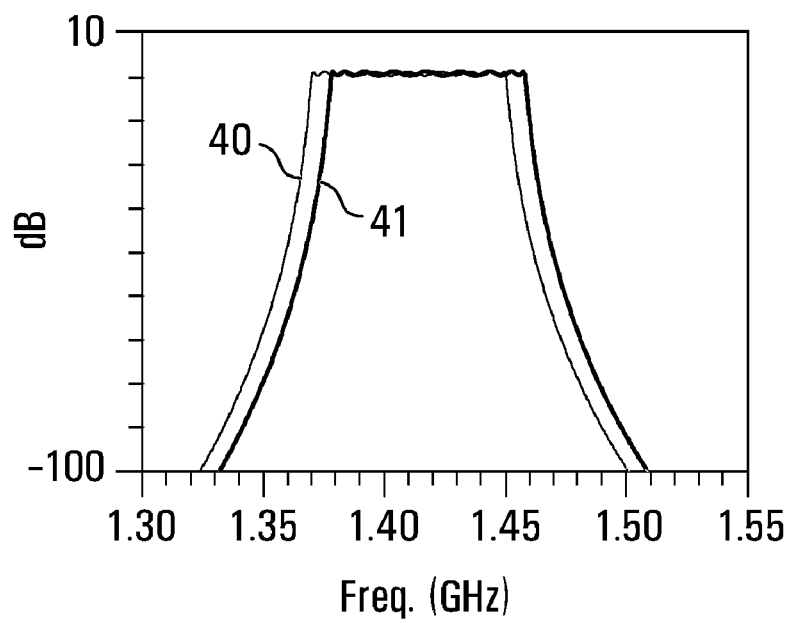
FIGS. 4A to 4E are graphical plots of filter responses of individual filters and a pass band filter response for a filter cascading the individual filters in accordance with some embodiments of the invention.

FIG. 4A illustrates a graphical plot of two filter responses of a wide band pass band filter, one filter response 40 showing the response at a high temperature (approximately 85° C.) and one filter response 41 showing the response at a low temperature (approximately −40° C.). The wide band filter is fabricated with a material having a higher coupling coefficient than the material used to fabricate the narrow band filter. FIG. 4A is substantially the same as FIG. 1A.

Figure 4B:
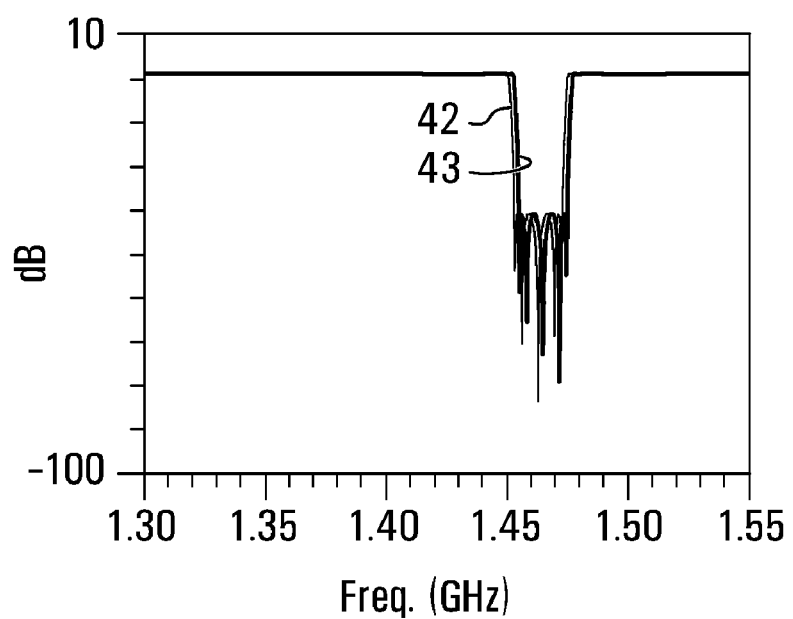

FIG. 4B illustrates a graphical plot of two filter responses of a narrow band rejection band filter, one filter response 42 showing the response at the high temperature and one filter response 43 showing the response at the low temperature. The narrow band filter is fabricated with a material having a lower coupling coefficient than the material used to fabricate the wideband filter and a lower temperature coefficient than the material used to fabricate the wideband filter. FIG. 4B is similar to FIG. 2B, except that the band reject filter response of FIG. 4B is located in the frequency range of 1.450 GHz to 1.480 GHz.

Figure 4D:
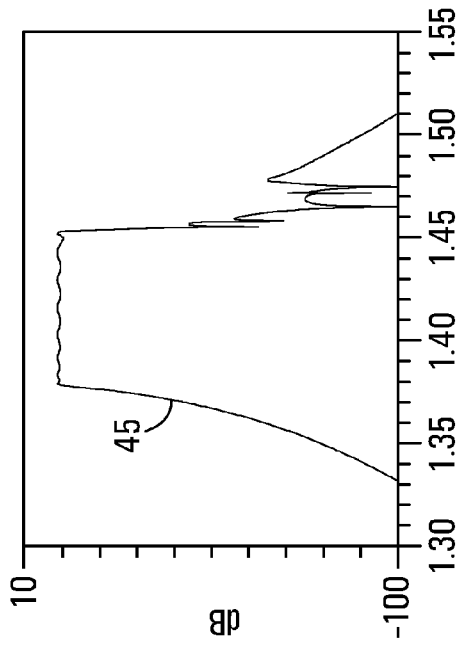
Figure 4C:
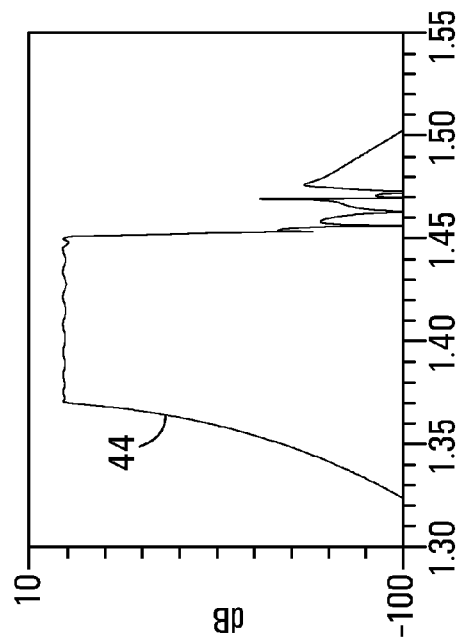

FIG. 4C illustrates a graphical plot of a filter response 44 of the resulting cascaded filters at the higher temperature. The frequency range and attenuation range of the plot are the same as FIGS. 4A and 4B. The 3 dB bandwidth of the filter response is in the range of approximately 0.080 GHz, from 1.370 GHz to 1.450 GHz. The transition band on the lower frequency side of the filter response is rather large, for example, a 20 dB down transition bandwidth is approximately 0.01 GHz, from 1.36 GHz to 1.37 GHz. The transition band on the higher frequency side of the filter response is smaller in comparison to the lower frequency side, for example, a 20 dB down transition bandwidth is approximately 0.001 GHz, from 1.450 GHz to 1.451 GHz.

FIG. 4D illustrates a graphical plot of a filter response 45 of the resulting cascaded filters at the lower temperature. The frequency range and attenuation range of the plot are the same as FIG. 4C. The 3 dB bandwidth of the filter response is in the range of approximately 0.075 GHz, from 1.378 GHz to 1.453 GHz. The transition band on the lower frequency side of the filter response is rather large, for example, a 20 dB down transition bandwidth is approximately 0.010 GHz, from 1.368 GHz to 1.378 GHz. The transition band on the higher frequency side of the filter response is smaller in comparison to the lower frequency side, for example, a 20 dB down transition bandwidth is approximately 0.001 GHz, from 1.453 GHz to 1.454 GHz.

Figure 4E:
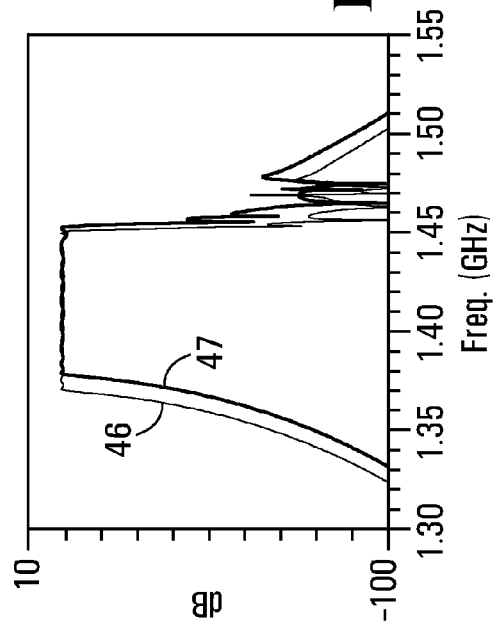

FIG. 4E illustrates a graphical plot of two filter responses of the resulting cascaded filters, one filter response 46 showing the response at the high temperature and one filter response 47 showing the response at the low temperature. This is essentially FIGS. 4C and 4D overlaid with one another. On the lower frequency side of the pass band filter responses 46,47, the transition bands are substantially parallel and have a spacing in frequency, for a given attenuation, of approximately 0.010 GHz. On the higher frequency side of the pass band filter responses 46,47, the transition bands are narrow compared to the lower frequency end and are substantially parallel. The high temperature and low temperature responses 46,47 have a spacing in frequency, for a given attenuation, of approximately 0.003 GHz. Therefore, the higher frequency side transition band of the pass band has approximately ⅔ less temperature dependent frequency drift than the lower frequency side transition band of the pass band.

In some embodiments, when designing an appropriate transition band for a filter based on cascading two filters in a manner as described above, a particular consideration as part of the design process is the band width of the rejection band of the narrow band filter. As shown in FIGS. 4A and 4B, the bandwidth of the rejection band of the narrow band filter must be wide enough to cover a lack of rejection caused by the frequency response drift of the wide band filter over the operating temperature range.

Care must be taken when designing filters to ensure that the entire cascaded filter performance meets the requirement at any temperature within a desired operational temperature range by properly designing the band width of the rejection band of the narrow band band-reject filter.

Example Embodiment #2

A second example embodiment in which a wide band pass band filter is cascaded with a filter having two narrow band rejection bands, one rejection band at the lower frequency side of the wide band filter and one rejection band at the higher frequency side of the wide band filter, will now be described in relation to FIGS. 5A to 5C.

Figure 5A:
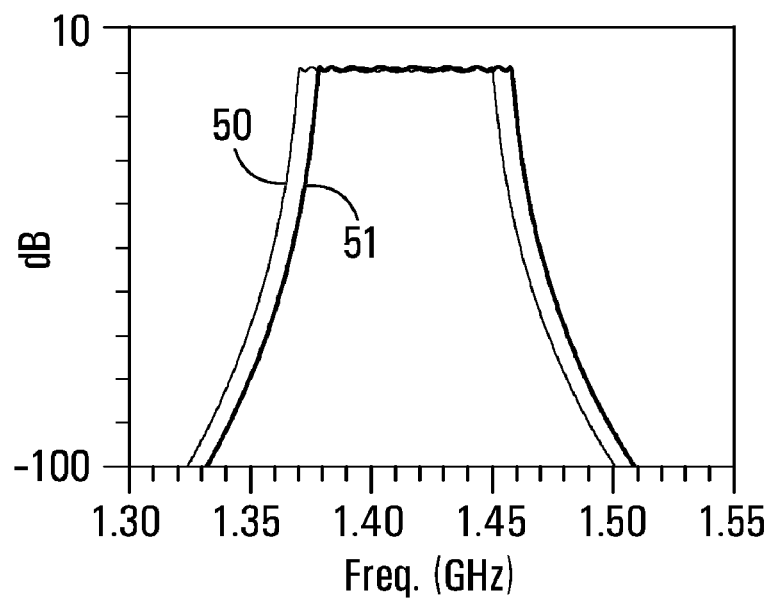
FIGS. 5A to 5C are graphical plots of filter responses of individual filters and a pass band filter response for a filter cascading the individual filters in accordance with some embodiments of the invention.

FIG. 5A includes a high temperature (approximately 85° C.) filter response 50 and a low temperature (approximately −40° C.) filter response 51, which are substantially the same as the two filter responses illustrated in FIG. 4A.

Figure 5B:
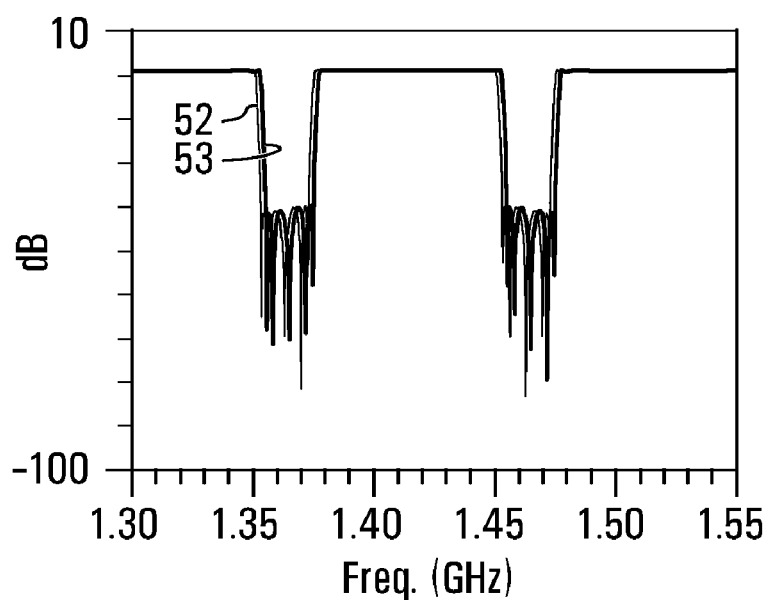

FIG. 5B illustrates a graphical plot of two filter responses of a narrow band rejection band filter, one filter response 52 showing the response at the high temperature and one filter response 53 showing the response at the low temperature. The narrow band filter is fabricated with a lower coupling coefficient material that is stable over temperature variation. FIG. 5B has a first rejection band that is approximately 0.030 GHz, from 1.35 GHz to 1.38 GHz and a second rejection band that is approximately 0.030 GHz, from 1.45 GHz to 1.48 GHz.

Figure 5C:
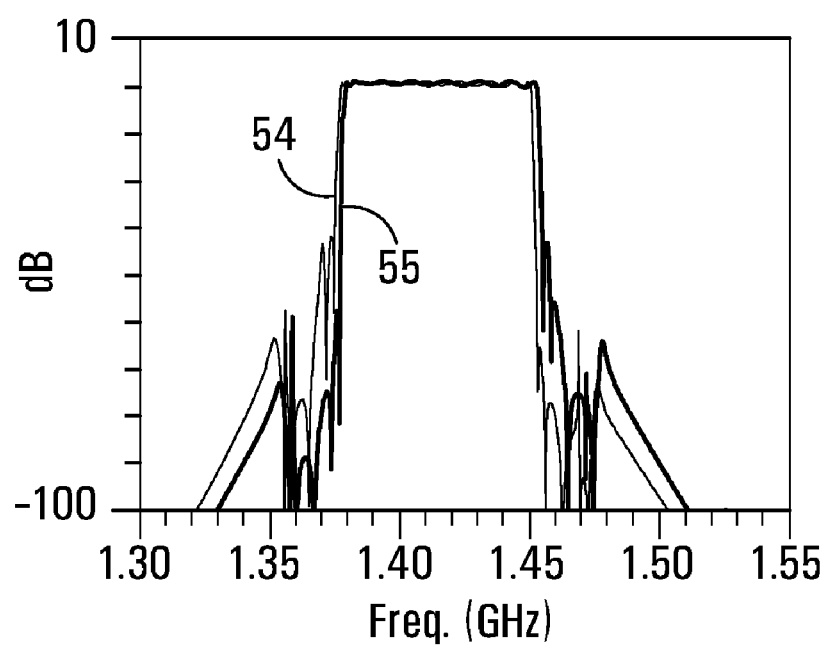

FIG. 5C illustrates a graphical plot of two filter responses of the resulting cascaded filters, one filter response 54 showing the response at the high temperature and one filter response 55 showing the response at the low temperature. On the lower frequency side of the filter responses 54,55, the transition bands are substantially parallel and have a spacing in frequency for a given attenuation of approximately 0.002 GHz. On the higher frequency side of the filter responses 54,55, the transition bands are substantially parallel and have a spacing in frequency for a given attenuation of approximately 0.002 GHz. As a result of cascading the two filters, the overall filter response has a wide band pass band with a steep transition band on each side of the pass band and very low frequency drift over temperature variation.

Example Embodiment #3

A third example embodiment in which a wide band band-reject filter is cascaded with a narrow band band-reject filter having a rejection band at the lower frequency side of the wide band filter will now be described in relation to FIG. 6A to 6C.

Figure 6A:
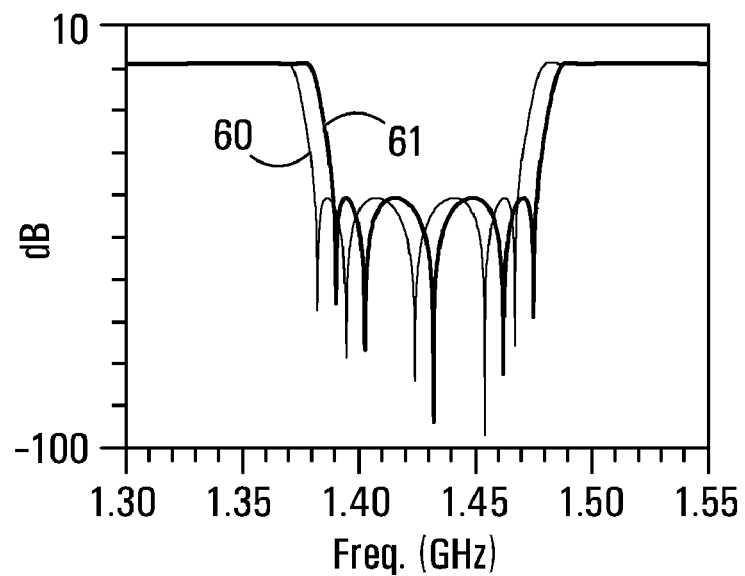
FIGS. 6A to 6C are graphical plots of filter responses of individual filters and a band-reject filter response for a filter cascading the individual filters in accordance with some embodiments of the invention.

FIG. 6A illustrates a graphical plot of two filter responses of a wide band band-reject filter, one filter response 60 showing the response at a high temperature (approximately 85° C.) and one filter response 61 showing the response at a low temperature (approximately −40° C.). The wide band filter is fabricated with a high coupling coefficient material. FIG. 6A is substantially the same as FIG. 1B.

Figure 6B:
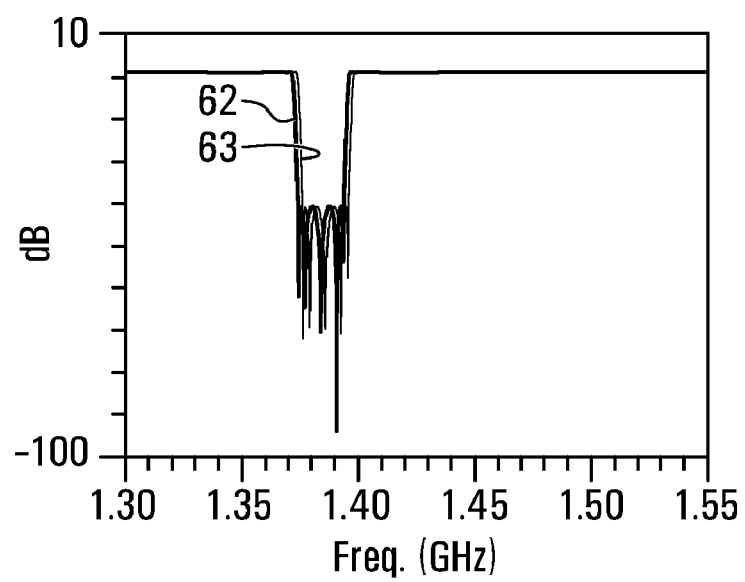

FIG. 6B illustrates a graphical plot of two filter responses of a narrow band band-reject filter, one filter response 62 showing the response at the high temperature and one filter response 63 showing the response at the low temperature. The narrow band filter is fabricated with a lower coupling coefficient material that is stable over temperature variation. FIG. 6B is similar to FIG. 2B, except that the band reject filter response of FIG. 6B is located in the frequency range of 1.37 GHz to 1.40 GHz.

Figure 6C:
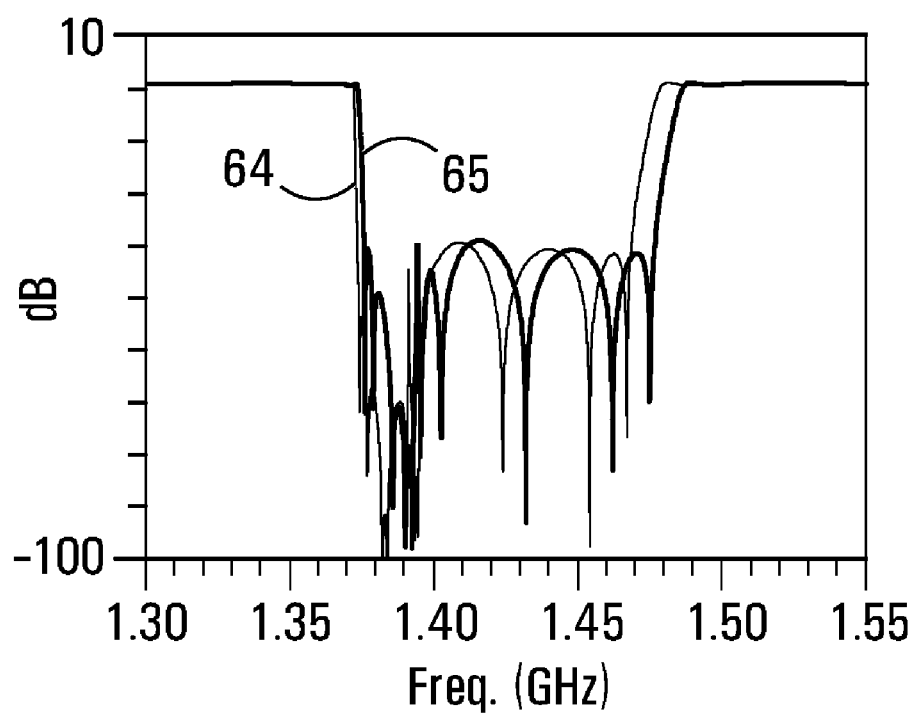

FIG. 6C illustrates a graphical plot of two filter responses of the two cascaded filters, one filter response 64 showing the response at the high temperature and one filter response 65 showing the response at the low temperature. On the lower frequency side of the filter responses 64,65, the transition bands are substantially parallel and have a spacing in frequency for a given attenuation of approximately 0.002 GHz. On the higher frequency side of the filter responses 64,65, the transition bands are substantially parallel and have a spacing in frequency for a given attenuation of approximately 0.010 GHz. Therefore, the lower frequency side transition band of the reject-band has approximately ⅘ less temperature dependent frequency drift than the higher frequency side transition band of the reject-band.

Example Embodiment #4

A fourth example embodiment in which a wide band band-reject filter is cascaded with a filter having two narrow band rejection bands, one rejection band at the lower frequency side of the wide band filter and one rejection band at the higher frequency side of the wide band filter, will now be described in relation to FIGS. 7A to 7C.

Figure 7A:
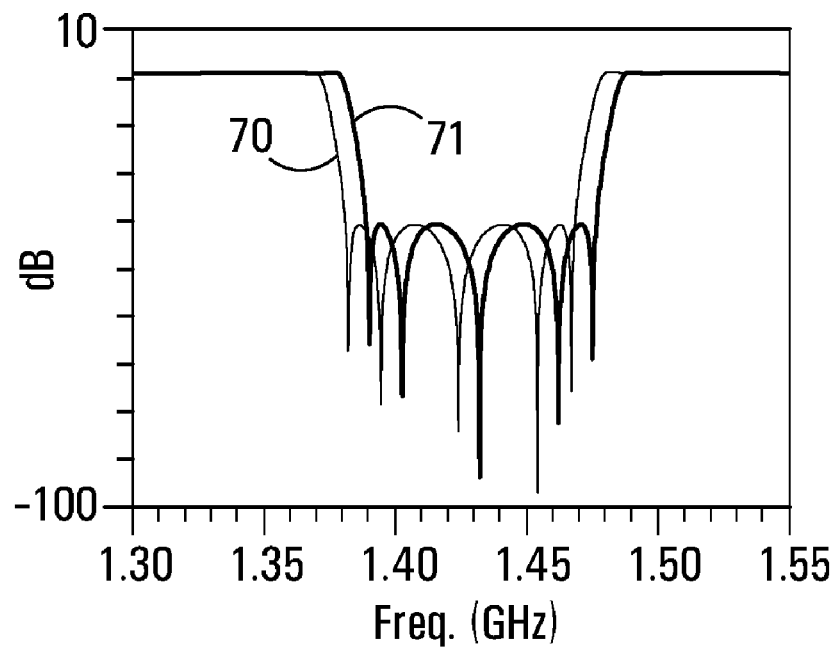
FIGS. 7A to 7C are graphical plots of filter responses of individual filters and a band-reject filter response for a filter cascading the individual filters in accordance with some embodiments of the invention.

FIG. 7A includes a high temperature (approximately 85° C.) filter response 70 and a low temperature (approximately −40° C.) filter response 71, which are substantially the same as the two filter responses illustrated in FIG. 6A.

Figure 7B:
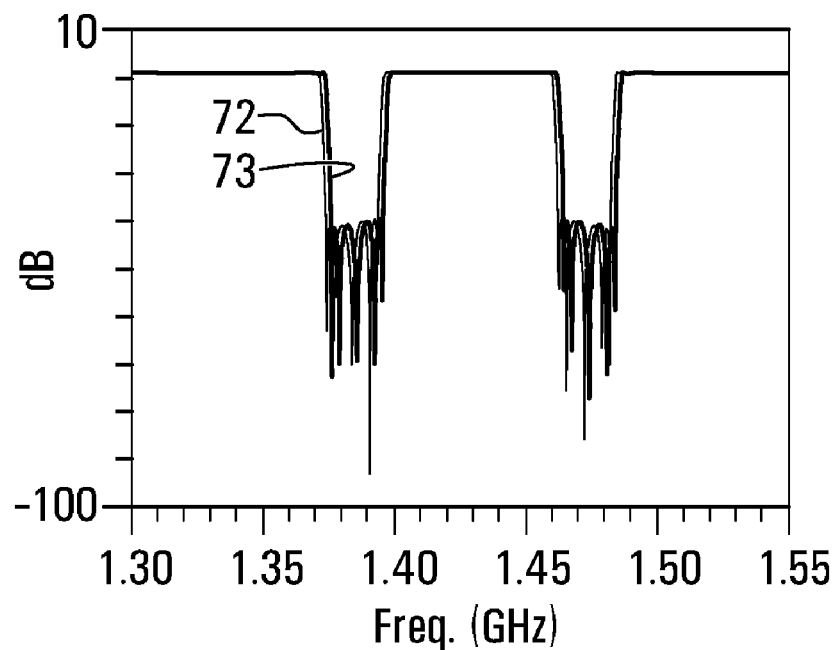

FIG. 7B illustrates a graphical plot of two filter responses of a narrow band band-reject filter, one filter response 72 showing the response at the high temperature and one filter response 73 showing the response at the low temperature. The narrow band filter is fabricated with a lower coupling coefficient material that is stable over temperature variation. FIG. 7B is substantially the same as the two filter responses illustrated in FIG. 6B.

Figure 7C:
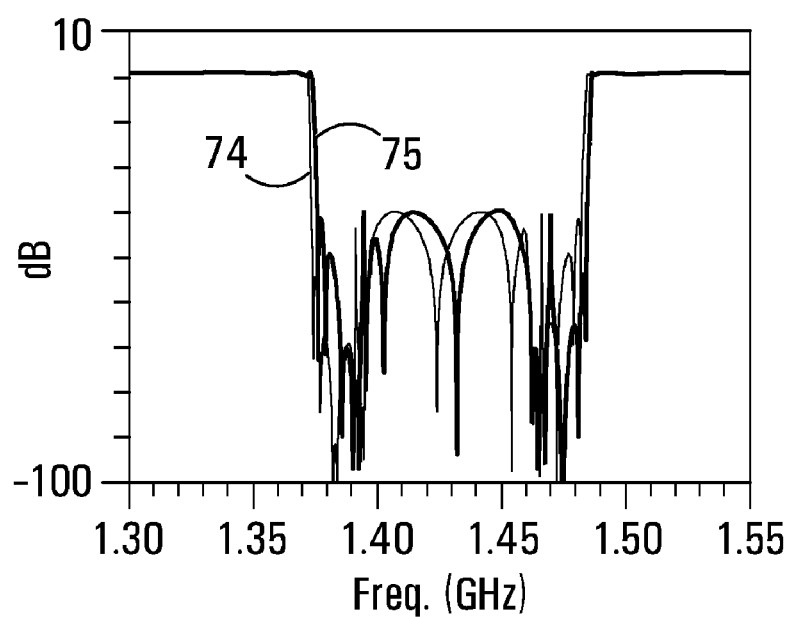

FIG. 7C illustrates a graphical plot of two filter responses of the resulting cascaded filters, one filter response 74 showing the response at the high temperature and one filter response 75 showing the response at the low temperature. On the lower frequency side of the filter responses 74,75, the transition bands are substantially parallel and have a spacing in frequency for a given attenuation of approximately 0.002 GHz. On the higher frequency side of the filter responses 74,75, the transition bands are substantially parallel and have a spacing in frequency for a given attenuation of approximately 0.002 GHz. As a result of the two cascaded filters, the overall filter response has a wide band rejection band with a steep transition band on each side of the reject-band and very low frequency drift over temperature variation.

The filter response parameters associated with the examples of FIGS. 4A-4E, 5A-5C, 6A-6C and 7A-7C are merely exemplary in nature. The parameters involved in designing filters for any given application, such as, but not limited to, transition band steepness, pass band or band-reject bandwidth and temperature dependent frequency drift, are implementation specific.

Figure 8:
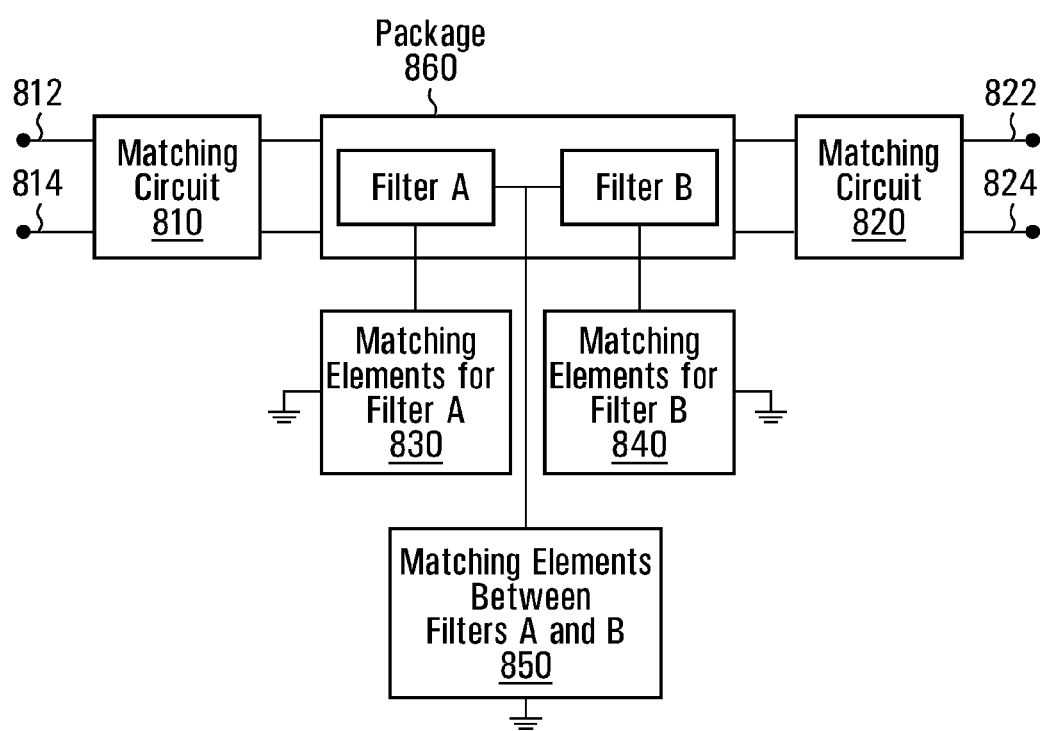
FIG. 8 is a block diagram of a cascaded filter and matching networks in accordance with some embodiments of the invention.

In some embodiments, matching networks may be used in conjunction with the cascaded filter design. In some embodiments the use of matching networks may improve performance of the overall filter. FIG. 8 is a block diagram illustrating how matching circuits may be used with respect to a cascaded filter design. In FIG. 8, Filter A and Filter B are cascaded together in package 860 and provide an overall filter response. A first matching circuit 810 is coupled to an input of Filter A. The first matching circuit 810 has a pair of inputs 812,814. An input to the cascaded filter may be applied at inputs 812,814. A second matching circuit 820 is coupled to an output of Filter B. The second matching circuit 820 has a pair of outputs 822,824. An output of the cascaded filter is provided at outputs 822,824. A third matching circuit 830 is coupled to Filter A for matching Filter A itself. The third matching circuit 830 is grounded. A fourth matching circuit 840 is coupled to Filter B for matching Filter B itself. The fourth matching circuit 840 is grounded. A fifth matching circuit 850 is coupled to a connection between Filter A and Filter B for matching the connection between Filter A and filter B. The fifth matching circuit 850 is grounded.

FIG. 8 illustrates a set of matching networks for a filter comprising two cascaded filters of the type generally described above. In some embodiments, not all of the matching networks described in FIG. 8 are used in conjunction with the cascaded filters. The number of matching networks and where they are located with respect to the cascaded filter are implementation specific.

Matching networks can be realized by using discrete components or transmission lines or some combination thereof. In some implementation the matching networks may include discrete inductors.

Figure 10:
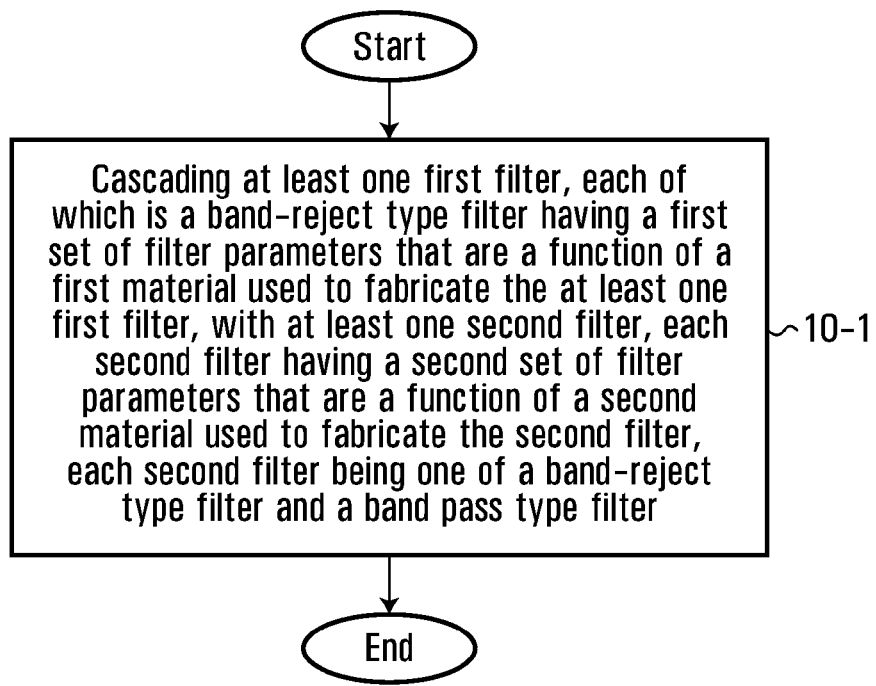
FIG. 10 is a flow chart of a method for implementing some embodiments of the invention.

A method of fabricating a filter will now be described with reference to FIG. 10.

A first step 10-1 of the method involves cascading at least one first filter with at least one second filter. Each first filter is a band-reject type filter having a first set of filter parameters that are a function of a first material used to fabricate the at least one first filter. Each second filter has a second set of filter parameters that are a function of a second material used to fabricate the at least one second filter. In addition, each second filter is one of a band-reject type filter and a band pass type filter. The first material and the second material are different materials. The filter has a third set of filter parameters that are a function of both the first material and the second material.

While the method above describes fabricating a filter using two filters, it is to be understood that, in accordance with embodiments of the invention described above, more than a single filter of each first and second filter may be used in cascading the filters such that there may be more than one first filter and more than one second filter. Furthermore, if more than one first filter is used, the materials used for the more than one first filter may not necessarily be the exact same, but are more similar to each other than to the material used for the more than one second filter. The same applies for more than one second filter.

Figure 11:
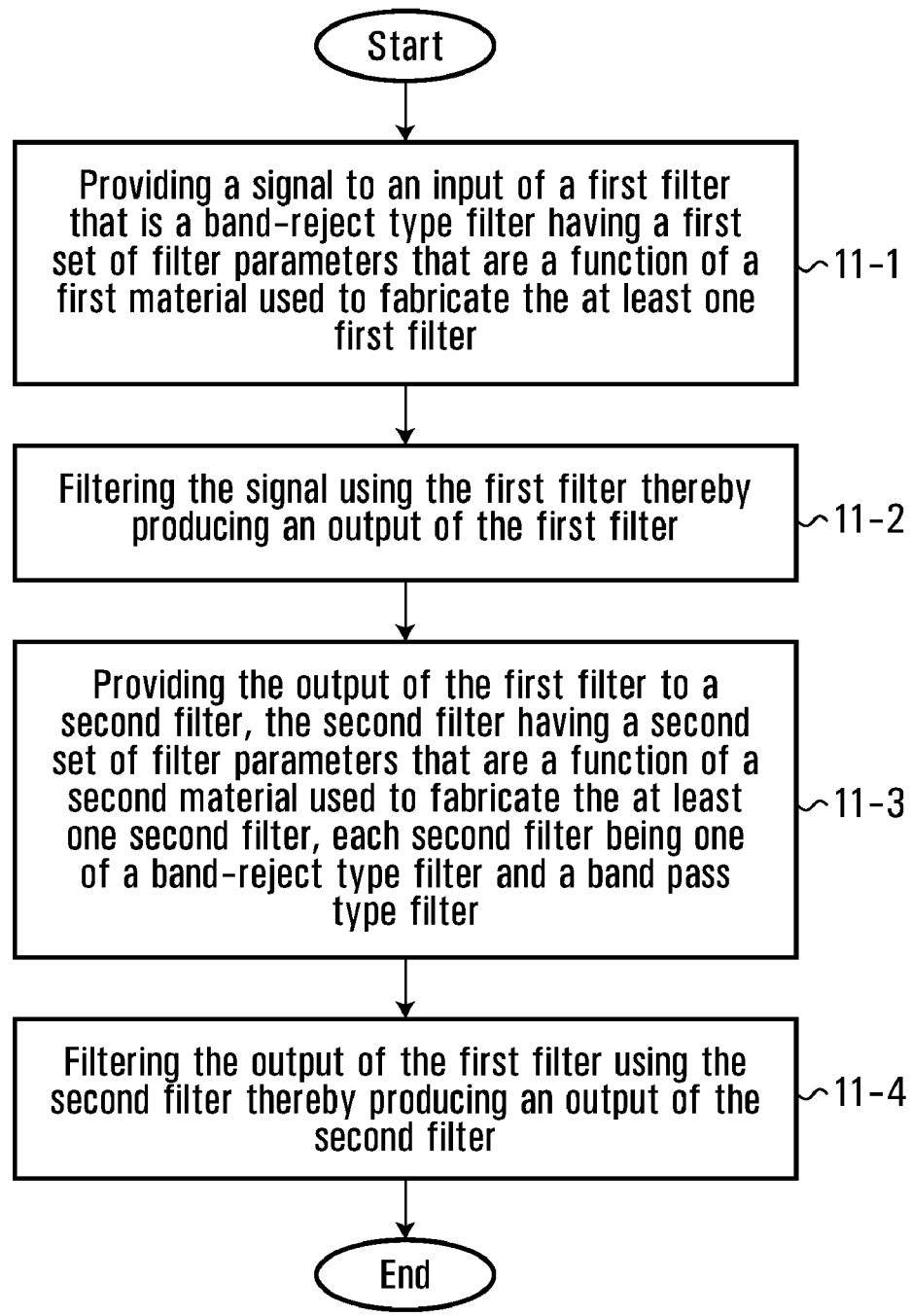
FIG. 11 is a flow chart of another method for implementing some embodiments of the invention.

A method of filtering a filter will now be described with reference to FIG. 11.

A first step 11-1 of the method involves providing a signal to an input of a first filter. The first filter is a band-reject type filter having a first set of filter parameters that are a function of a first material used to fabricate the at least one first filter.

A second step 11-2 of the method involves filtering the signal using the first filter thereby producing an output of the first filter.

A third step 11-3 of the method involves providing the output of the first filter to a second filter, the second filter having a second set of filter parameters that are a function of a second material used to fabricate the at least one second filter, each second filter being one of a band-reject type filter and a band pass type filter.

A fourth step 11-4 of the method involves filtering the output of the first filter using the second filter thereby producing an output of the second filter.

The first material and the second material are different materials. The combination of the at least one first filter and the at least one second filter used to filter the signal has a third set of filter parameters that are a function of both the first material and the second material.

While the method above describes filtering a signal using two filters, it is to be understood that, in accordance with embodiments of the invention described above, more than a single filter of each first and second filter may be used to filter a signal such that there may be more than one first filter and more than one second filter. Furthermore, if more than one first filter is used, the materials used for the more than one first filter may not necessarily be the exact same, but are more similar to each other than to the material used for the more than one second filter. The same applies for more than one second filter.

Some embodiments of the invention also may provide a low cost and compact size type duplexer or multiplexer with the performance of low insertion loss, high power handling capability, wide band pass band or wide band rejection band, narrow transition band and low temperature dependent frequency drift by applying aspects of the present cascaded filter invention.

Numerous modifications and variations of the present invention are possible in light of the above teachings. It is therefore to be understood that within the scope of the appended claims, the invention may be practised otherwise than as specifically described herein.

The invention claimed is:

1. A filter comprising:
   at least one first filter having a first set of filter parameters that are a function of a first material used to implement the at least one first filter;
   at least one second filter having a second set of filter parameters that are a function of a second material used to implement the at least one second filter;
   wherein the at least one first filter is coupled to the at least one second filter to form a composite filter having a set of composite filter parameters, the composite filter parameters comprising a temperature dependent frequency drift that is primarily governed by a temperature coefficient of one of the first material and the second material,
   wherein the at least one first filter is a band reject filter having at least one rejection band, the at least one rejection band having transition bands that are steeper than transition bands of the at least one second filter.

2. The filter of claim 1, wherein the composite filter parameters comprise a filter bandwidth that is primarily governed by a mechanical coupling coefficient of the other of the first material and the second material.

3. The filter of claim 1, wherein the at least one first filter is coupled in series with the at least one second filter.

4. The filter of claim 1, wherein the at least one first filter is any one of a surface acoustic wave (SAW) filter, a thin film bulk acoustic resonator (FBAR) filter and a bulk acoustic wave (BAW) filter.

5. The filter of claim 1, wherein the at least one second filter is any one of a surface acoustic wave (SAW) filter, a thin film bulk acoustic resonator (FBAR) filter and a bulk acoustic wave (BAW) filter.

6. The filter of claim 1, wherein the at least one first filter and the at least one second filter are mounted in a common package.

7. The filter of claim 1, further comprising at least one circuit matching element.

8. A filter comprising:
   at least one first filter having a first set of filter parameters that are a function of a first material used to implement the at least one first filter;
   at least one second filter having a second set of filter parameters that are a function of a second material used to implement the at least one second filter;
   wherein the at least one first filter is coupled to the at least one second filter to form a composite filter having a set of composite filter parameters, the composite filter parameters comprising a temperature dependent frequency drift that is primarily governed by a temperature coefficient of one of the first material and the second material,
   wherein the at least one first filter is coupled in series with the at least one second filter,
   wherein the at least one second filter is a band pass filter having a pass band wider than the rejection band of the at least one first filter.

9. A filter comprising:
   at least one first filter having a first set of filter parameters that are a function of a first material used to implement the at least one first filter;
   at least one second filter having a second set of filter parameters that are a function of a second material used to implement the at least one second filter;
   wherein the at least one first filter is coupled to the at least one second filter to form a composite filter having a set of composite filter parameters, the composite filter parameters comprising a temperature dependent frequency drift that is primarily governed by a temperature coefficient of one of the first material and the second material,
   wherein the at least one first filter is coupled in series with the at least one second filter,
   wherein the at least one second filter is a band reject filter having a rejection band wider than the rejection band of the at least one first filter.

10. A method of making a filter, comprising:
    fabricating at least one first filter using a first material, the at least one first filter having a first set of filter parameters that are a function of the first material;
    fabricating at least one second filter using a second material, the at least one second filter having a second set of filter parameters that are a function of the second material;
    coupling the at least one first filter to the at least one second filter to form a composite filter having a set of composite filter parameters, the composite filter parameters comprising a temperature dependent frequency drift that is primarily governed by a temperature coefficient of one of the first material and the second material,
    wherein fabricating at least one first filter comprises fabricating the at least one first filter as a band reject filter having at least one rejection band, the at least one rejection band having transition bands that are steeper than transition bands of the at least one second filter.

11. The method of claim 10, wherein the composite filter parameters comprise a filter bandwidth that is primarily governed by a mechanical coupling coefficient of the other of the first material and the second material.

12. The method of claim 10, wherein coupling the at least one first filter to the at least one second filter comprises coupling the at least one first filter in series with the at least one second filter.

13. The method of claim 10, wherein fabricating at least one first filter comprises fabricating the at least one first filter as any one of a surface acoustic wave (SAW) filter, a thin film bulk acoustic resonator (FBAR) filter and a bulk acoustic wave (BAW) filter.

14. The method of claim 10, wherein fabricating at least one second filter comprises fabricating the at least one second filter as any one of a surface acoustic wave (SAW) filter, a thin film bulk acoustic resonator (FBAR) filter and a bulk acoustic wave (BAW) filter.

15. The method of claim 10, comprising mounting the at least one first filter and the at least one second filter in a common package.

16. The method of claim 10, further comprising coupling at least one circuit matching element to at least one of the at least one first filter and the at least one second filter.

17. A method of making a filter, comprising:
fabricating at least one first filter using a first material, the at least one first filter having a first set of filter parameters that are a function of the first material;
fabricating at least one second filter using a second material, the at least one second filter having a second set of filter parameters that are a function of the second material;
coupling the at least one first filter to the at least one second filter to form a composite filter having a set of composite filter parameters, the composite filter parameters comprising a temperature dependent frequency drift that is primarily governed by a temperature coefficient of one of the first material and the second material,
wherein coupling the at least one first filter to the at least one second filter comprises coupling the at least one first filter in series with the at least one second filter,
wherein fabricating at least one second filter comprises fabricating the at least one second filter as a band pass filter having a pass band wider than the rejection band of the at least one first filter.

18. A method of making a filter, comprising:
fabricating at least one first filter using a first material, the at least one first filter having a first set of filter parameters that are a function of the first material;
fabricating at least one second filter using a second material, the at least one second filter having a second set of filter parameters that are a function of the second material;
coupling the at least one first filter to the at least one second filter to form a composite filter having a set of composite filter parameters, the composite filter parameters comprising a temperature dependent frequency drift that is primarily governed by a temperature coefficient of one of the first material and the second material,
wherein coupling the at least one first filter to the at least one second filter comprises coupling the at least one first filter in series with the at least one second filter,
wherein fabricating at least one second filter comprises fabricating the at least one second filter as a band reject filter having a rejection band wider than the rejection band of the at least one first filter.

* * * * *